(12) United States Patent
Beaulieu et al.

(10) Patent No.: US 8,524,596 B2
(45) Date of Patent: Sep. 3, 2013

(54) TECHNIQUES FOR IMPROVING BOND PAD PERFORMANCE

(75) Inventors: Frederic Beaulieu, Granby (CA); Gobinda Das, Hopewell Junction, NY (US); Steven J. Duda, Underhill Center, VT (US); Matthew J. Farinelli, Riverdale, NY (US); Adreanne Kelly, Philadelphia, PA (US); Samuel McKnight, New Paltz, NY (US); William J. Murphy, N. Ferrisburg, VT (US)

(73) Assignee: International Business Machines Corporation, Armonk, NY (US)

( * ) Notice: Subject to any disclaimer, the term of this patent is extended or adjusted under 35 U.S.C. 154(b) by 16 days.

(21) Appl. No.: 13/550,105

(22) Filed: Jul. 16, 2012

(65) Prior Publication Data

US 2012/0279767 A1 Nov. 8, 2012

Related U.S. Application Data

(63) Continuation of application No. 11/115,936, filed on Apr. 27, 2005, now abandoned.

(51) Int. Cl.
*H01L 21/44* (2006.01)

(52) U.S. Cl.
USPC .......................... 438/614; 438/652; 257/750

(58) Field of Classification Search
USPC .......................................................... 438/614
See application file for complete search history.

(56) References Cited

U.S. PATENT DOCUMENTS

| | | | | |
|---|---|---|---|---|
| 4,965,656 A | * | 10/1990 | Koubuchi et al. | 257/742 |
| 6,265,300 B1 | * | 7/2001 | Bhansali et al. | 438/612 |
| 6,444,567 B1 | * | 9/2002 | Besser et al. | 438/625 |
| 6,762,503 B2 | * | 7/2004 | Lee | 257/781 |
| 6,815,336 B1 | * | 11/2004 | Shue et al. | 438/626 |

* cited by examiner

*Primary Examiner* — Ajay K Arora
(74) *Attorney, Agent, or Firm* — Ryan, Mason & Lewis, LLP

(57) ABSTRACT

Techniques for bond pad fabrication are provided. In one aspect, a method of forming a bond pad comprises the following steps. At least one alloying element is selectively introduced to at least a portion of at least one surface of the bond pad. The at least one alloying element is diffused into at least a portion of the bond pad through one or more thermal cycles. The at least one alloying element may be selectively introduced to the bond pad by depositing an alloying element layer comprising the at least one alloying element onto the bond pad and patterning and etching at least a portion of the layer.

20 Claims, 3 Drawing Sheets

TECHNIQUES FOR IMPROVING BOND PAD PERFORMANCE

CROSS-REFERENCE TO RELATED APPLICATIONS

This application is a continuation of U.S. patent application Ser. No. 11/115,936, filed Apr. 27, 2005, incorporated by reference herein.

FIELD OF THE INVENTION

The present invention relates to chip processing and, more particularly, to bond pads and techniques for fabrication thereof.

BACKGROUND OF THE INVENTION

There is presently an increased demand for custom application-specific integrated circuit (ASIC) chips. As a result, production output requirements have increased.

One particular challenge associated with increasing production of ASIC chips is the testing that is required to sort out functional chips from non-functional chips. Specifically, each chip produced should be tested before packaging. However, with the sizes of the chips and associated components shrinking, testing becomes increasingly more difficult.

Probe stations typically use an array of tungsten wire probes to contact bond pads on the surface of each chip. These probes are held stationary and the chips to be tested are raised until the probes make proper electrical contact with the bond pads. These probes are used to apply the necessary power, ground and signal inputs and outputs to test the functions of a chip.

In order to ensure that a proper electrical contact is made between the bond pad and the probe, it is standard practice to employ a "scrubbing" motion with the probes when contacting the bond pad. This motion, however, causes damage to the bond pad surface, typically rendering the damaged portions unusable.

As chip sizes decrease, bond pad sizes also decrease. As a result, the marks left by the probes will consume an ever larger fraction of the bond pad surface.

In order to reduce the size and damage of the scrubs marks, probing parameters such as probe force, probe velocity and overdrive have been varied. Unfortunately, a trade-off exists between finding the probe parameters that minimize the size and damage of the scrubs marks and the low contact resistance, e.g., as achieved by a greater probe force, needed to perform proper chip testing. In fact, it has been found that current probe technology and parameter variations can no longer provide sufficiently low contact resistance while at the same time providing low scrub damage.

It is known that using a copper alloy material, such as aluminum-copper alloy, to form the bond pad will, to some degree, improve the electrical contact resistance properties of the bond pad. Therefore, bond pads typically comprise aluminum alloyed with small amounts, e.g., less than or equal to about two atomic percent (at. %), of copper. The amount of copper, however, has to be limited to these small amounts because its presence adversely affects the fabrication of the bond pad. Specifically, higher levels of copper adversely affect dry etch processes typically employed to create the bond pad (making it difficult to properly define various features). Further, bulk copper addition to the bond pad during fabrication can adversely affect the mechanical properties of the bond pad. For example, copper concentrations greater than four percent can cause a decrease in the yield strength (a measure of the force required to cause a plastic deformation of the material) of the bond pad material.

Therefore, techniques for bond pad fabrication that result in robust bond pads, with high yield strength, that sustain little, if any, damage during testing, yet maintain a low contact resistance would be desirable.

SUMMARY OF THE INVENTION

Techniques for bond pad fabrication are provided. In one aspect of the invention, a method of forming a bond pad comprises the following steps. At least one alloying element is selectively introduced to at least a portion of at least one surface of the bond pad. The at least one alloying element is diffused into at least a portion of the bond pad through one or more thermal cycles. The at least one alloying element may be selectively introduced to the bond pad by depositing an alloying element layer comprising the at least one alloying element onto the bond pad and patterning and etching at least a portion of the layer.

A more complete understanding of the present invention, as well as further features and advantages of the present invention, will be obtained by reference to the following detailed description and drawings.

DETAILED DESCRIPTION OF PREFERRED EMBODIMENTS

Figure 1:
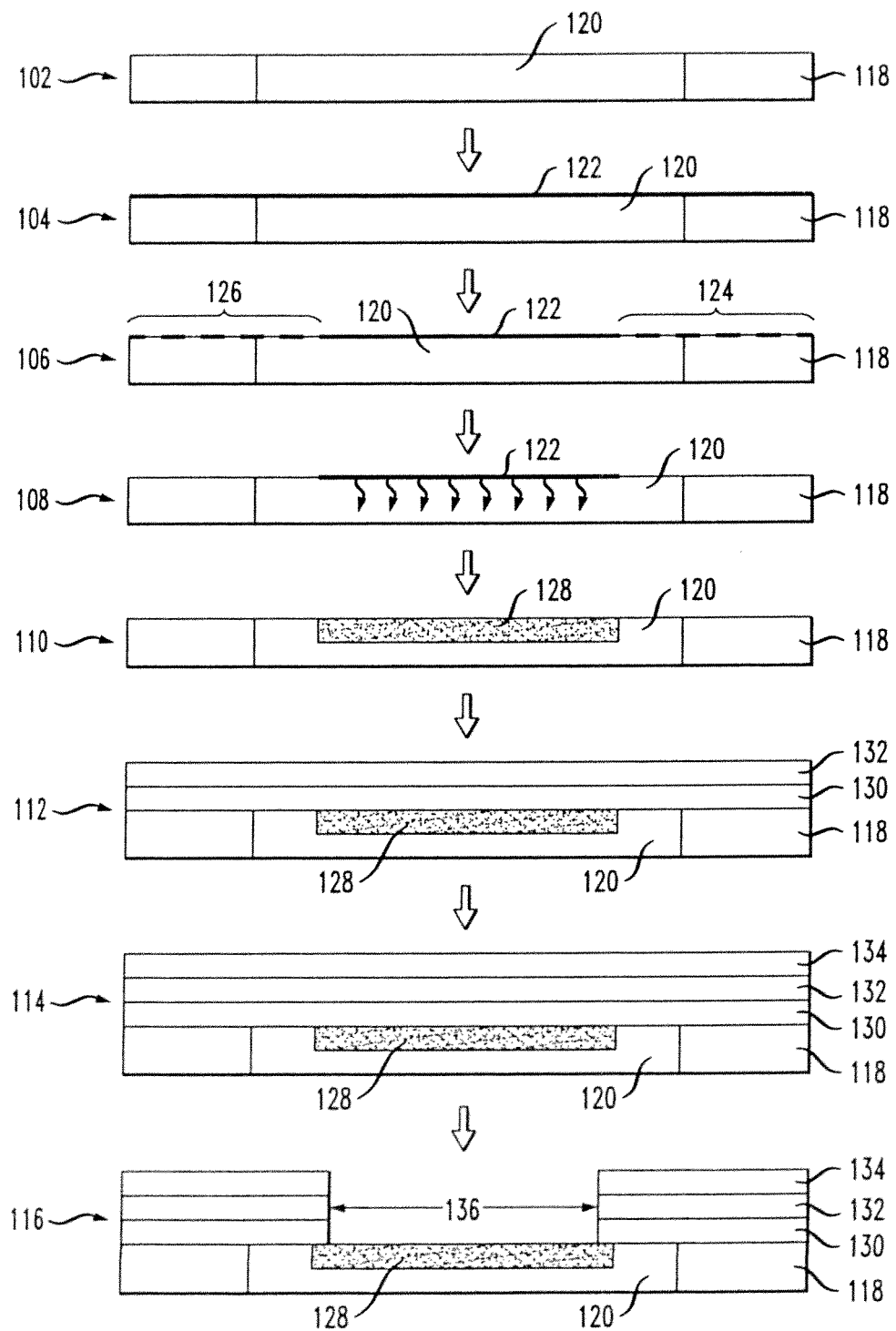
FIG. 1 is a diagram illustrating an exemplary methodology for forming a bond pad according to an embodiment of the present invention.

FIG. 1 is a diagram illustrating exemplary methodology 100 for forming a bond pad. In step 102 of FIG. 1, chip 118, e.g., an integrated circuit chip, comprising bond pad 120, is provided. Chip 118 may comprise one or more terminal dielectric regions.

According to an exemplary embodiment, chip 118 is up to about 1.2 micrometers (μm) thick, and bond pad 120 comprises aluminum. Aluminum is low in cost, has high conductivity and is easy to process. Bond pad 120 may also comprise less than or equal to about two atomic percent (at. %) of an additional element, or elements, e.g., copper alloyed with the aluminum.

It is to be understood that the choice of an aluminum bond pad is merely exemplary and that any other suitable bond pad materials may be employed. By way of example only, suitable bond pad materials include, but are not limited to, aluminum, gold, nickel and combinations comprising at least one of the foregoing materials.

In step 104, alloying element layer 122 is deposited on at least one surface of chip 118, and over bond pad 120. According to an exemplary embodiment, the alloying element employed comprises copper, and alloying element layer 122 comprises a pure (e.g., at least 99.999 percent pure) copper layer.

It is to be understood that the choice of a copper alloying element is merely exemplary and that any other suitable alloying elements may be employed. Suitable alloying elements include, but are not limited to, copper, nickel, cobalt, palladium, silver, gadolinium and combinations comprising at least one of the foregoing elements. Further, the use of a single alloying element is also merely exemplary and according to the techniques presented herein, multiple alloying elements may be employed. For example, aluminum/nickel/gadolinium alloys may be employed.

The term "alloying element," as used herein, refers to any element that may form an alloy with one or more elements of the bond pad material.

Alloying element layer 122 may be deposited onto chip 118 using any suitable deposition techniques. Suitable deposition techniques include, but are not limited to, blanket deposition techniques, such as vacuum deposition techniques, e.g., vacuum evaporation or sputtering. Other suitable deposition techniques include, but are not limited to, electrolytic plating, electroless plating, metallo-organic vapor deposition, atomic layer deposition and other thin film deposition techniques.

According to an exemplary embodiment, alloying element layer 122 is deposited on chip 118 as a blanket film having a thickness of up to about 250 angstroms. The thickness of alloying element layer 122 depends on several factors, such as the desired concentration of alloying element in bond pad 120, the total volume of bond pad 120 and the bulk diffusivity of the alloying element into bond pad 120.

In step 106, standard lithography techniques are used to pattern the surface of alloying element layer 122, such that the alloying element, or elements, from alloying element layer 122 may be selectively introduced into aluminum bond pad 120. For example, unwanted portions 124 and 126 of alloying element layer 122 can be removed, so as to substantially prevent alloying element(s) from being introduced to certain areas of chip 118, e.g., below portions 124 and 126. Specifically, the alloying element should be introduced primarily to the bond pad section of chip 118, e.g., to prevent electrical shorting or degradation of the material of chip 118.

According to an exemplary embodiment, patterning of alloying element layer 122 is achieved using a photosensitive material. Suitable photosensitive materials include, but are not limited to, photoimaging polymers, photoresist, photosensitive polyimide (PSPI), dry film resists and combinations comprising at least one of the foregoing materials. Suitable photoresist materials include those available from the Shipley Corporation, of Marlborough, Mass. Suitable dry film resists include those available from DuPont Printed Circuit Materials, of Durham, N.C.

Once patterned, alloying element layer 122 can then be etched. According to one exemplary embodiment, alloying element layer 122 is etched, e.g., dip etched, using a conventional wet chemical etchant. The choice of etchant used is determined by the bond pad structure/composition and alloying element used.

By way of example only, when the alloying element comprises copper and the bond pad comprises aluminum, a one molar (1 M) solution of ammonium peroxydisulfate ($NH_4S_2O_8$) in ten volume percent (vol. %) sulfuric acid ($H_2SO_4$) with an organic complexing agent, such as 3-amino-1,2,4-triazole, may be used as a wet etchant solution to selectively etch the copper. This etchant is fast (e.g., etches copper at a rate of greater than about six micrometers per minute) and highly selective.

Other etching techniques may also be employed. By way of example only, reverse current electrolytic techniques and/or chemical-mechanical polishing (CMP) techniques may be employed. For example, reverse current electrolytic techniques may be used to electropolish away undesired material.

Next, any chemical etchant present is rinsed off and the photoresist is stripped. As a result, alloying element layer 122, remains above only those areas of bond pad 120 wherein diffusion of the alloying element is desired.

In step 108, bond pad 120 and alloying element layer 122 are heated. Heating serves to diffuse the alloying element from alloying element layer 122 into, and alloy with the element, e.g., aluminum, in bond pad 120.

According to an exemplary embodiment, bond pad 120 and alloying element layer 122 are heated in an annealing oven evacuated of atmospheric gases. Preferably, the annealing oven is supplied with a flowing stream of one or more reducing gasses to substantially reduce, or prevent, any oxidation of the diffusing alloying element. Suitable reducing gasses for use in conjunction with the teachings of the present invention include, but are not limited to, one or more of hydrogen in argon ($H_2$ in Ar), carbon monoxide in argon (CO in Ar) and nitric oxide in nitrogen (NO in $N_2$). According to a particular embodiment, heating is conducted in a vacuum furnace in the presence of five percent $H_2$ in Ar as a reducing gas.

Once inside the oven, bond pad 120 and alloying element layer 122 are subjected to one or more thermal cycles. For example, according to one exemplary embodiment, bond pad 120 and alloying element layer 122 are subjected to at least one thermal cycle with an ultimate temperature, e.g., the highest temperature reached, of 350° C.

As a result of the heating process, at least a portion of the alloying element present in alloying element layer 122 diffuses into and alloys with the element(s) in bond pad 120. The alloying element may diffuse through substantially the entire thickness of bond pad 120, or alternatively, only a portion of the thickness thereof. For example, the alloying element may diffuse into only a near-surface region of bond pad 120, e.g., near-surface region 128 in step 110. See below. An exemplary temperature-time profile is shown, for example, in FIG. 2, described below.

In step 110, as mentioned above, the alloying element may diffuse only into near-surface region 128 of bond pad 120. According to an exemplary embodiment, near-surface region 128 of bond pad 120 comprises up to about a two micrometer region from the surface of bond pad 120. For example, near-surface region 128 of bond pad 120 may comprise up to about a 1.2 micrometer region from the surface of bond pad 120.

According to another exemplary embodiment, as described below, near-surface region 128 may comprise a nanometer-sized region of bond pad 120. For example, near-surface region 128 may comprise up to about a 100 nanometer region from the surface of bond pad 120.

Near-surface region 128 of bond pad 120 may comprise greater than or equal to about 90 percent of all the alloying element present in bond pad 120, e.g., greater than or equal to about 90 percent of all copper in bond pad 120 will be in near-surface region 128. For example, near-surface region 128 of bond pad 120 may comprise greater than or equal to about 95 percent of all the alloying element present in bond pad 120.

Thus, according to an embodiment wherein the alloying element is copper and bond pad 120 comprises aluminum, at least a portion of bond pad 120 would, after heating, comprise aluminum-copper alloy. Further, the depth of alloying, or how far into bond pad 120 the copper diffuses, may be regulated by the ultimate temperature and/or the time spent at the ultimate temperature. For example, increasing the ultimate temperature, while keeping time constant will increase the depth of alloying. Similarly, increasing the time, but keeping the ultimate temperature constant will likewise increase the depth of alloying.

In step 112, oxide layer 130 may be deposited on a surface of chip 118. Nitride layer 132 may then be deposited on a surface of oxide layer 130, e.g., opposite chip 118.

According to an exemplary embodiment, oxide layer 130 and nitride layer 132 will serve, on a completed chip, as electrical isolation materials, e.g., between various wiring layers and other bond pads. Other suitable electrical isolation materials may be employed in addition to, or in place of, one or more of oxide layer 130 and nitride layer 132, including, but not limited to, fluorinated-silica glass (FSG) materials, silicon-based organic materials, hydrogenated silicon oxycarbide (SiCOH) materials and combinations comprising at least one of the foregoing electrical isolation materials.

According to one exemplary embodiment, oxide layer 130 has a thickness of from about 4000 angstroms (Å) to about 5000 Å. For example, oxide layer 130 may have a thickness of about 4500 Å. Nitride layer 132 has a thickness of from about 3500 Å to about 4500 Å. For example, nitride layer 132 may have a thickness of about 4000 Å.

In step 114, a PSPI layer 134 is deposited on a side of nitride layer 132, e.g., opposite oxide layer 130. PSPI layer 134 may serve during etching of oxide layer 130 and nitride layer 132, e.g., to expose bond pad 120.

In step 116, as mentioned above, oxide layer 130 and nitride layer 132 are etched so as to expose bond pad 120. Specifically, etching is used to remove a portion of oxide layer 130, a portion of nitride layer 132 and a portion of PSPI layer 134 in area 136, so as to provide access to bond pad 120.

Figure 2:
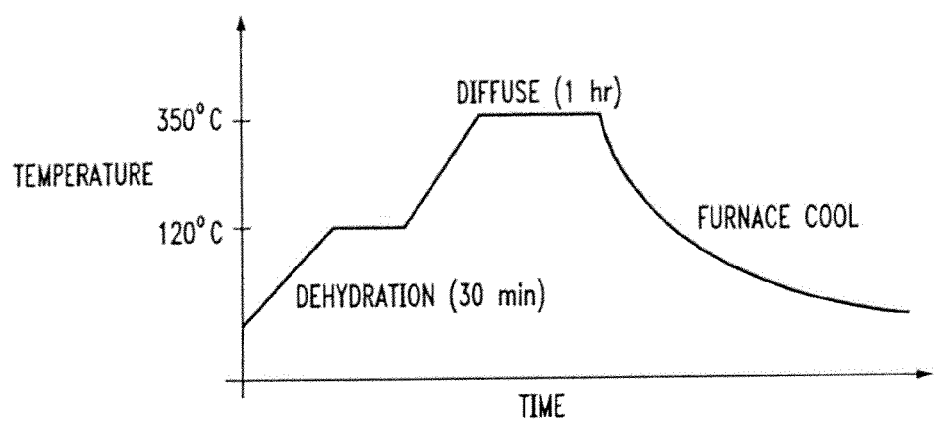
FIG. 2 is a graph illustrating an exemplary temperature-time profile according to an embodiment of the present invention.

FIG. 2 is a graph illustrating an exemplary temperature-time profile that may be used in accordance with the instant techniques. In graph 200, temperature is plotted as a function of time.

As shown in graph 200, three distinct phases are present. The first phase, the dehydration phase, is conducted for a duration of about 30 minutes and reaches a temperature of about 120° C. The dehydration phase serves to remove water from the surface of the alloying element layer. Water and/or oxygen molecules present on the alloying element layer, at high temperatures, e.g., as during the diffusion phase (see below), will consume the alloying element by forming oxides, e.g., copper oxides, with it. Water and/or oxygen molecules will also diffuse into the alloying element layer/bond pad interface and impede formation of the, e.g., aluminum-copper alloy.

The next phase, the diffusion phase, is conducted for a duration of about one hour and reaches a temperature of about 350° C. During this phase, the atoms of the alloying element acquire enough thermal energy to diffuse into regions of the bond pad (e.g., near-surface region 128 of FIG. 1). It is notable that since the treatments to the bond pad are being performed while the bond pad is associated with the chip, treatment temperatures should be kept below that which would cause damage to the chip. For example, heat treatment temperatures may be kept below about 400° C. to prevent damage to the chip.

The last phase, the cooling phase, is conducted for a duration suitable to bring the oven, e.g., furnace, back to room temperature. The cool down time and rate of cooling determines how abrupt the diffusion will be. For example, a bond pad left to cool from about 350° C. back to about room temperature by natural cooling would likely have the alloying element present throughout its entire thickness. Thus, according to one exemplary embodiment, the bond pad has the alloying element diffused throughout its entire thickness.

Depending on the particular application, having the alloying element throughout the entire thickness of the bond pad may, however, be undesirable. For example, copper, e.g., as from an alloying element layer, diffused through the entire thickness of an aluminum bond pad can inhibit further processing of the bond pad and/or alter its electrical properties. Thus, in this instance, copper diffusion is preferably limited to the near-surface region of the bond pad.

Rapid thermal cycles may be employed to abruptly end the diffusion stage and create a more distinct interface between the alloyed region of the bond pad and the rest of the bond pad. For example, an abrupt cooling phase might last for a duration of up to about 20 minutes.

The temperatures and durations shown in FIG. 2 are merely exemplary. For example, the particular temperatures employed may, at least in part, be a function of the thermal budget allowed for a given product. By way of example only, experiments have shown that copper diffusion can take place at temperatures as low as 250° C. Similarly, the particular durations employed may, at least in part, be a function of the diffusivity of the alloying element into the bond pad. Diffusion times decrease exponentially with increasing temperature. Therefore, if temperatures of about 250° C. rather than, e.g., 350° C., are employed, diffusion times would be exponentially increased.

Further, the thermal cycle shown in FIG. 2, and described herein, is suitable for a standard annealing oven that utilizes natural cooling, e.g., having cooling rates of less than 4° C. per minute. However, one or more other thermal cycle profiles may be used in accordance with the present techniques. For example, one or more rapid thermal annealing (RTA) cycles may be employed to quickly and abruptly change the temperature of the chip.

The bond pad is then cooled. Further etching may be performed to remove residual surface alloying element layer, if any remains. Suitable etching techniques include, but are not limited to, the wet chemical etchant techniques, reverse current electrolytic techniques and CMP techniques described above. This step is optional. The product may then proceed to testing and packaging.

One notable advantage of the above bond pad treatment processes is that the treated bond pad has a higher strength, as compared to an untreated bond pad. Specifically, by diffusing an alloying element into at least a portion of the bond pad, the bond pad becomes more resistant to damage caused by probes during testing of the chip.

Figure 3A:
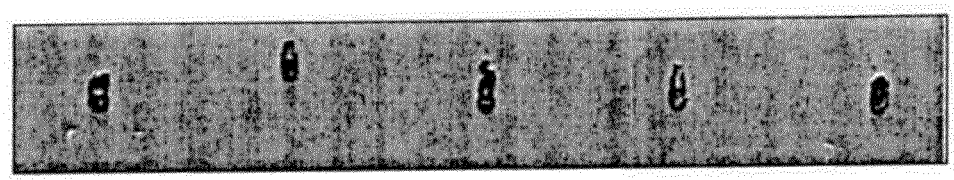
FIG. 3A is an image illustrating damage to an untreated aluminum bond pad due to probe testing.
Figure 3B:
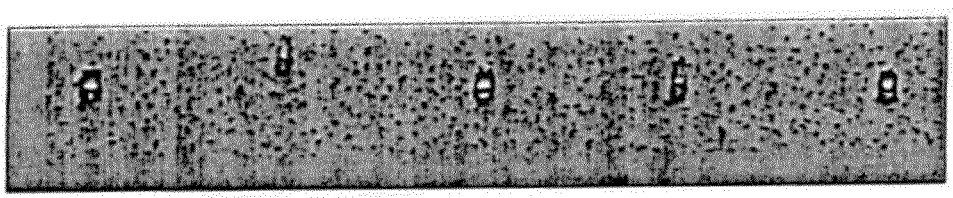
FIG. 3B is an image illustrating damage to a treated aluminum bond pad due to probe testing according to an embodiment of the present invention.

For example, FIG. 3A is an image illustrating damage to an untreated aluminum bond pad due to probe testing and FIG. 3B is an image illustrating damage to a treated aluminum bond pad due to probe testing. Specifically, the aluminum bond pad in FIG. 3B has been treated according to the present techniques, using copper as the alloying element. A comparison of the bond pads shown in FIGS. 3A and 3B reveals that treatment according to the instant techniques substantially reduces test probe damage to the bond pad surface. Specifically, the scrub marks shown in FIG. 3B are about ten percent smaller, e.g., shorter, than those shown in FIG. 3A.

Figure 4A:
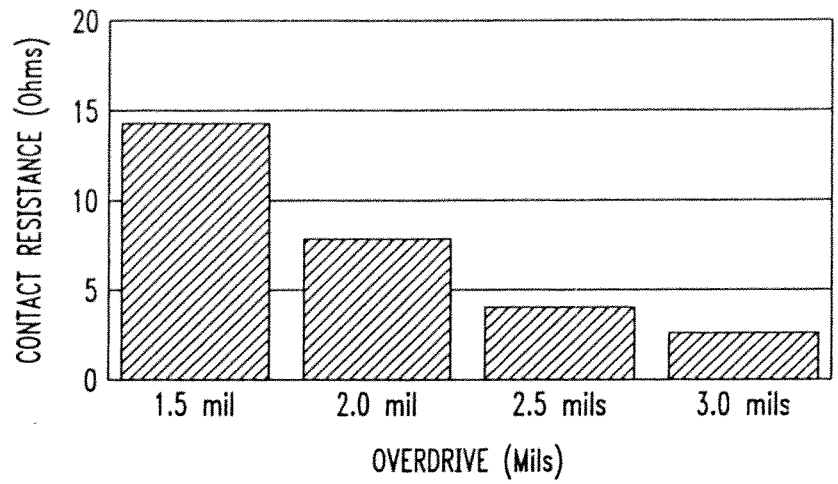
FIG. 4A is a graph illustrating contact resistance of an untreated aluminum bond pad.
Figure 4B:
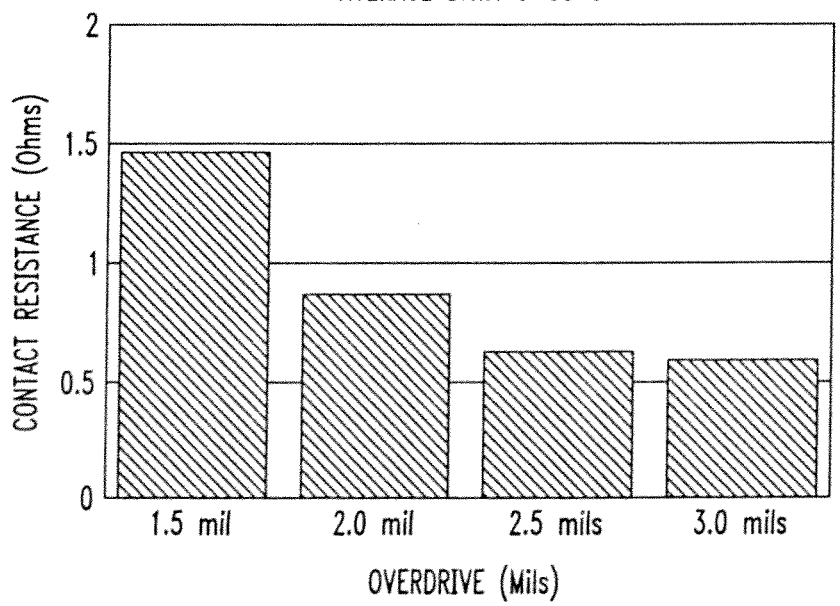
FIG. 4B is a graph illustrating contact resistance of a treated aluminum bond pad according to an embodiment of the present invention.

Another notable advantage of the above bond pad treatment process is that the treated bond pad has a decreased contact resistance, as compared to an untreated bond pad. FIG. 4A, for example, is a graph illustrating contact resistance of an untreated aluminum bond pad. FIG. 4B, by comparison, is a graph illustrating contact resistance of a treated aluminum bond pad. The aluminum bond pad in FIG. 4B has been treated according to the present techniques, using copper as the alloying element.

Specifically, the graphs shown in FIGS. 4A and 4B show the contact resistance, measured in ohms, as a function of overdrive, measured in mils, for treated and untreated bond pads, respectively, during testing with a wire probe. Overdrive provides a measure of probe deflection past initial contact with the bond pad. For example, when the bond pad is pushed against the probe to make electrical/mechanical contact, the probe deflects after making initial contact with the bond pad. Overdrive is the measure of this deflection.

As is shown both in the graph in FIG. 4A and the graph in FIG. 4B, contact resistance decreases with increasing overdrive. However, for each of the overdrive values tested, the graph in FIG. 4B shows that treatment of the bond pad according to the present techniques markedly decreases contact resistance, as compared to the untreated bond pad represented by the graph in FIG. 4A. This decreased contact resistance means that during testing a lower probe force may be employed. A lower probe force can reduce, or eliminate, damage to the bond pad.

According to the techniques presented herein, the bond pad with an alloying element(s) alloyed therein may comprise a nanostructured material. Specifically, the alloying elements, during diffusion, may segregate into nanometer-sized grain boundary regions of the bond pad material. For example, when the alloying element comprises either gadolinium or nickel and the bond pad comprises aluminum, the alloying elements tend to segregate into nanometer-sized boundary regions between individual aluminum grains. This results in a nanostructured material.

Further, as described above, the near-surface region of the bond pad into which the alloying element is diffused, may comprise a nanometer-sized region of the bond pad. Thus, a nanostructured bond pad would be formed.

In conclusion, the instant techniques may be employed to improve bond pad performance. Namely, with regard to chip testing, bond pads treated according to the instant techniques exhibit decreased contact resistance and increased strength. Further, the treated bond pads exhibit improved adhesion properties when wire bonds are attached thereto.

Although illustrative embodiments of the present invention have been described herein, it is to be understood that the invention is not limited to those precise embodiments, and that various other changes and modifications may be made by one skilled in the art without departing from the scope or spirit of the invention.

We claim:

1. A method of forming a bond pad, the method comprising the steps of:
    selectively introducing at least one alloying element to at least a portion of at least one surface of the bond pad, wherein selectively introducing comprises:
    depositing a layer of the at least one alloying element onto the bond pad surface;
    patterning at least a portion of the alloying element layer on the bond pad surface to target one or more areas of subsequent diffusion of the at least one alloying element into the bond pad;
    etching the patterned alloying element layer to create one or more areas of alloying element layer remaining only above the one or more areas of the bond pad surface targeted for subsequent diffusion; and
    diffusing the at least one alloying element into only the one or more areas of the bond pad targeted for diffusion through one or more rapid thermal cycles, wherein said diffusion of the at least one alloying element is limited to a maximum depth of two micrometers below said surface of the bond pad due to said one or more rapid thermal cycles.

2. The method of claim 1, wherein the at least one alloying element is diffused into a near-surface region of the bond pad.

3. The method of claim 1, wherein the at least one alloying element is diffused into a near-surface region of the bond pad which comprises up to about a two micrometer region from a surface of the bond pad.

4. The method of claim 1, wherein the at least one alloying element is diffused into a near-surface region of the bond pad which comprises up to about a 1.2 micrometer region from a surface of the bond pad.

5. The method of claim 1, wherein the at least one alloying element comprises one or more of copper, nickel, cobalt, palladium, silver and gadolinium.

6. The method of claim 1, wherein the bond pad comprises one or more of aluminum, gold and nickel.

7. The method of claim 1, wherein the alloying element layer is deposited using one or more of vacuum evaporation, sputtering, electrolytic plating, electroless plating, metalloorganic vapor deposition, atomic layer deposition and thin film deposition techniques.

8. The method of claim 1, wherein the patterning step comprises use of one or more of a photosensitive material, a photoimaging polymer, a photoresist, a photosensitive polyimide and a dry film resist.

9. The method of claim 1, wherein the etching step comprises use of a wet chemical etchant.

10. The method of claim 1, wherein the etching step comprises use of reverse current electrolytic techniques.

11. The method of claim 1, wherein the etching step comprises use of chemical-mechanical polishing techniques.

12. The method of claim 1, wherein the at least one alloying element is diffused into the at least a portion of the bond pad through a plurality of thermal cycles.

13. A bond pad comprising:
    at least one alloying element present only in one or more areas of a near-surface region of the bond pad pre-targeted for diffusion of the at least one alloying element, wherein the at least one alloying element is present only to a maximum depth of two micrometers below said near-surface region of the bond pad and wherein the bond pad exhibits a substantially distinct interface between the alloying element in said near-surface region of the bond pad and a region of the bond pad not containing the alloying element.

14. The bond pad of claim 13, comprising one or more of aluminum, gold and nickel.

15. The bond pad of claim 13, wherein the at least one alloying element comprises one or more of copper, nickel, cobalt, palladium, silver and gadolinium.

16. The bond pad of claim 13, wherein the at least one alloying element comprises an aluminum/nickel/gadolinium alloy.

17. The bond pad of claim 13, wherein the near-surface region comprises up to about a two micrometer region from a surface of the bond pad.

18. The bond pad of claim 13, wherein the near-surface region comprises up to about a 1.2 micrometer region from a surface of the bond pad.

19. The bond pad of claim 13, wherein the near-surface region comprises greater than or equal to about 90 percent of the at least one alloying element present in the bond pad.

20. The bond pad of claim 13, wherein the near-surface region comprises greater than or equal to about 95 percent of the at least one alloying element present in the bond pad.

* * * * *